(12) United States Patent
Liu

(10) Patent No.: US 11,315,977 B2
(45) Date of Patent: Apr. 26, 2022

(54) PHOTOSENSITIVE ASSEMBLY AND METHOD FOR PREPARING THE SAME, ARRAY SUBSTRATE, AND DISPLAY DEVICE

(71) Applicant: BOE TECHNOLOGY GROUP CO., LTD., Beijing (CN)

(72) Inventor: Wei Liu, Beijing (CN)

(73) Assignee: BOE TECHNOLOGY GROUP CO., LTD., Beijing (CN)

( * ) Notice: Subject to any disclaimer, the term of this patent is extended or adjusted under 35 U.S.C. 154(b) by 128 days.

(21) Appl. No.: 16/618,379

(22) PCT Filed: Apr. 19, 2019

(86) PCT No.: PCT/CN2019/083360
§ 371 (c)(1),
(2) Date: Dec. 1, 2019

(87) PCT Pub. No.: WO2019/206027
PCT Pub. Date: Oct. 31, 2019

(65) Prior Publication Data
US 2021/0143205 A1 May 13, 2021

(30) Foreign Application Priority Data
Apr. 28, 2018 (CN) .......................... 201810403652.8

(51) Int. Cl.
*H01L 27/146* (2006.01)
*H01L 27/32* (2006.01)
*H01L 29/786* (2006.01)

(52) U.S. Cl.
CPC .. *H01L 27/14643* (2013.01); *H01L 27/14616* (2013.01); *H01L 27/14689* (2013.01); *H01L 27/3234* (2013.01); *H01L 29/7869* (2013.01)

(58) Field of Classification Search
CPC ............. H01L 27/3234; H01L 27/3227; H01L 27/14643
See application file for complete search history.

(56) References Cited

U.S. PATENT DOCUMENTS 5,233,181 A * 8/1993 Kwansnick ......... H01L 31/0216
250/208.1
5,399,884 A * 3/1995 Wei ................... H01L 27/14643
257/59

(Continued)

FOREIGN PATENT DOCUMENTS

CN 107359168 A 11/2017
CN 108336100 A 7/2018

(Continued)

OTHER PUBLICATIONS

International Search Report and Written Opinion for Application No. PCT/CN2019/083360, dated Jul. 24, 2019, 11 Pages.

*Primary Examiner* — Alia Sabur
(74) *Attorney, Agent, or Firm* — Brooks Kushman P.C.

(57) ABSTRACT

Embodiments of the present disclosure provide a photosensitive assembly, a method for preparing the same, an array substrate, and a display device. The photosensitive assembly includes a substrate, a thin-film transistor and a photosensitive unit on a surface of the substrate, and an insulating layer between an active layer of the thin-film transistor and the photosensitive unit. The photosensitive unit includes a first electrode, a photosensitive layer, and a second electrode sequentially arranged on the substrate. The drain electrode of the thin-film transistor is electrically connected to the first electrode, the active layer is located on a surface of the insulating layer away from the substrate, and the photosensitive unit is located on a surface of the insulating layer proximate to the substrate.

16 Claims, 4 Drawing Sheets

(56) References Cited

U.S. PATENT DOCUMENTS

| | | | |
|---|---|---|---|
| 5,480,810 A * | 1/1996 | Wei | H01L 27/14643 |
| | | | 257/E27.133 |
| 7,307,301 B2 * | 12/2007 | Possin | H01L 27/14623 |
| | | | 257/292 |
| 2015/0364527 A1 * | 12/2015 | Wang | H01L 27/3244 |
| | | | 257/40 |
| 2016/0126501 A1 | 5/2016 | Kim et al. | |
| 2016/0322416 A1 * | 11/2016 | Nara | H01L 29/7869 |
| 2017/0062540 A1 | 3/2017 | Kim et al. | |
| 2019/0019813 A1 | 1/2019 | Ren et al. | |
| 2020/0058680 A1 | 2/2020 | Liu | |

FOREIGN PATENT DOCUMENTS

| | | |
|---|---|---|
| CN | 108376688 A | 8/2018 |
| CN | 207966980 U | 10/2018 |
| CN | 208028063 U | 10/2018 |

\* cited by examiner

PHOTOSENSITIVE ASSEMBLY AND METHOD FOR PREPARING THE SAME, ARRAY SUBSTRATE, AND DISPLAY DEVICE

CROSS-REFERENCE TO RELATED APPLICATIONS

This application is the U.S. national phase of PCT Application No. PCT/CN2019/083360 filed on Apr. 19, 2019, which claims priority to Chinese Patent Application No. 201810403652.8 filed on Apr. 28, 2018, which are incorporated herein by reference in their entireties.

TECHNICAL FIELD

The present disclosure relates to the field of display technology, in particular to a photosensitive assembly, a method for preparing the same, an array substrate, and a display device.

BACKGROUND

In recent years, an organic light emitting diode (OLED) has been widely used in the field of high performance display due to its advantages of self-illumination, wide viewing angle, short response, high luminous efficiency, wide color gamut, and low power consumption.

However, due to the drift of the threshold voltage (Vth) in the OLED pixel circuit, the existing thin-film transistor (TFT) is difficult to meet the electrical performance requirements of the OLED display panel. Therefore, compensation technology is needed to improve the display quality.

SUMMARY

Embodiments of the present disclosure provide a photosensitive component, a method for preparing the same, an array substrate, and a display device. Such embodiments of the present disclosure can prevent the hydrogen element in the photosensitive layer from adversely affecting the electrical properties of the thin-film transistor.

In order to achieve the above object, embodiments of the present disclosure adopt the following technical solutions.

In a first aspect, a photosensitive assembly is provided. The photosensitive assembly includes a substrate, a thin-film transistor and a photosensitive unit on a surface of the substrate, and an insulating layer between an active layer of the thin-film transistor and the photosensitive unit; in which the photosensitive unit includes a first electrode, a photosensitive layer, and a second electrode sequentially arranged on the substrate; a drain electrode of the thin-film transistor is electrically connected to the first electrode; an active layer of the thin-film transistor is located on a surface of the insulating layer away from the substrate, and the photosensitive unit is located on a surface of the insulating layer proximate to the substrate.

Optionally, the photosensitive assembly includes a first electrode layer and a second electrode layer; the first electrode layer includes a gate electrode of the thin-film transistor and a first electrode of the photosensitive unit; the second electrode layer includes a conductive lead, and a source electrode and a drain electrode of the thin-film transistor, the conductive lead is electrically connected to the second electrode; the insulating layer is a gate insulating layer of the thin film transistor.

Optionally, the thin-film transistor further includes an etch stopping layer covering the insulating layer.

Optionally, the pattern of the photosensitive layer is the same as that of the second electrode.

Optionally, an orthogonal projection of at least one of the gate electrode and the active layer on the substrate does not overlap an orthogonal projection of the photosensitive unit on the substrate.

In a second aspect, an array substrate is provided. The array substrate includes the photosensitive assembly according to the first aspect.

In a third aspect, a display device is provided. The display device includes the array substrate according to the second aspect.

In a fourth aspect, a method for preparing a photosensitive assembly is provided. The method includes forming a thin-film transistor, a photosensitive unit, and an insulating layer between an active layer of the thin-film transistor and the photosensitive unit on a surface of a substrate; in which the photosensitive unit includes a first electrode, a photosensitive layer, and a second electrode sequentially arranged on the substrate; a drain electrode of the thin-film transistor is electrically connected to the first electrode; an active layer of the thin-film transistor is located on a surface of the insulating layer away from the substrate, and the photosensitive unit is located on a surface of the insulating layer proximate to the substrate.

Optionally, the step of forming the thin-film transistor, the photosensitive unit, and the insulating layer between the active layer of the thin-film transistor and the photosensitive unit on the surface of the substrate includes: forming a first electrode layer on the substrate, wherein the first electrode layer includes a gate electrode of the thin-film transistor and a first electrode of the photosensitive unit; forming a photosensitive layer and a second electrode on a surface of the first electrode away from the substrate; forming a gate insulating layer and the active layer sequentially on the substrate on which the second electrode is formed; and forming a second electrode layer on the substrate on which the active layer is formed, wherein the second electrode layer including a conductive lead, and a source electrode and a drain electrode of the thin-film transistor, and the conductive lead is electrically connected to the second electrode.

Optionally, before the forming the second electrode layer on the substrate on which the active layer is formed, the method further includes: forming an etch stopping layer covering the insulating layer.

Optionally, the photosensitive layer and the second electrode are formed by a single patterning process.

Optionally, an orthogonal projection of at least one of the gate electrode and the active layer on the substrate does not overlap an orthogonal projection of the photosensitive unit on the substrate.

BRIEF DESCRIPTION OF THE DRAWINGS

In order to illustrate the technical solutions of the present disclosure or prior art in a clearer manner, the drawings desired for the present disclosure or prior art will be briefly hereinafter. Obviously, the following drawings merely relate to some embodiments of the present disclosure. Based on these drawings, a person skilled in the art may obtain the other drawings without any creative effort.

DETAILED DESCRIPTION

The technical solutions in the embodiments of the present disclosure will be described hereinafter in conjunction with the drawings in the embodiments of the present disclosure in a clear and complete manner. Obviously, the following embodiments merely relate to a part of, rather than all of, the embodiments of the present disclosure. Based on these embodiments, a person skilled in the art may, without any creative effort, obtain the other embodiments, which also fall within the scope of the present disclosure.

Figure 1:
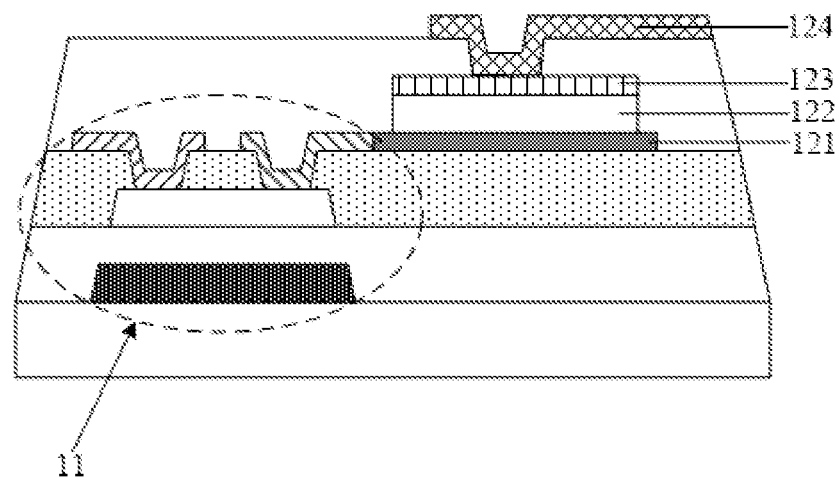
FIG. 1 is a schematic view showing an array substrate provided by the related art.

As shown in FIG. 1, in the related art, a thin-film transistor 11 is formed first, and then a lower electrode 121 of an optical sensor, a photosensitive sensing layer 122 and an upper electrode 123, a passivation layer (PVX), and a conductive lead 124 electrically connected to the upper electrode 123 of the optical sensor by a via hole on the passivation layer are formed sequentially.

However, since the photosensitive sensing layer 122 usually includes a material containing a large amount of hydrogen (H) element such as a-Si, and the photosensitive sensing layer 122 is formed for a relatively long time, in the process of forming the photosensitive sensing layer 122, hydrogen easily diffuses into the channel region (the region in the active layer between the source electrode and the drain electrode is a channel region when the thin-film transistor operates), thereby adversely affecting the electrical performance of the thin-film transistor 11. For example, since the hydrogen element in the channel region is excessive, the thin-film transistor 11 is uncontrolled and always in an open state.

Figure 2A:
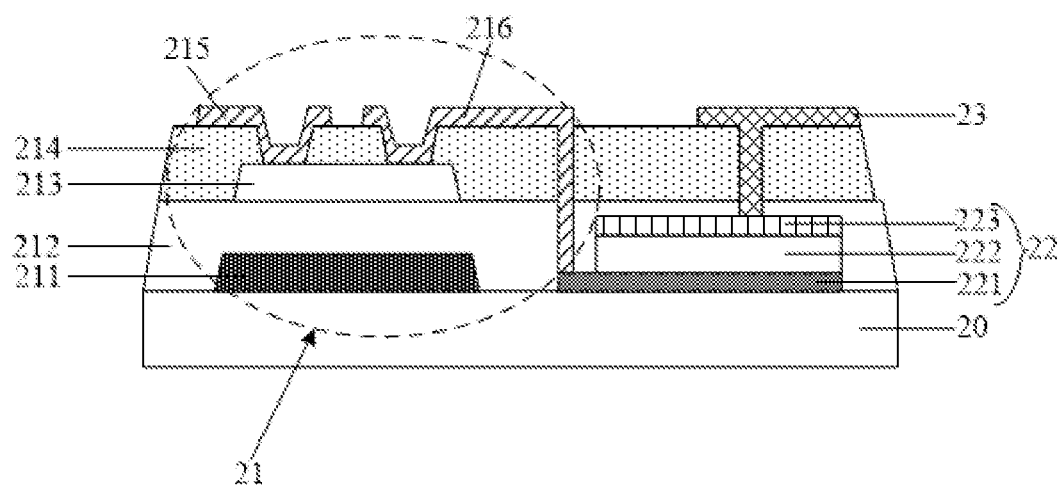
FIG. 2a is a schematic view showing a photosensitive assembly according to an embodiment of the present disclosure.
Figure 2B:
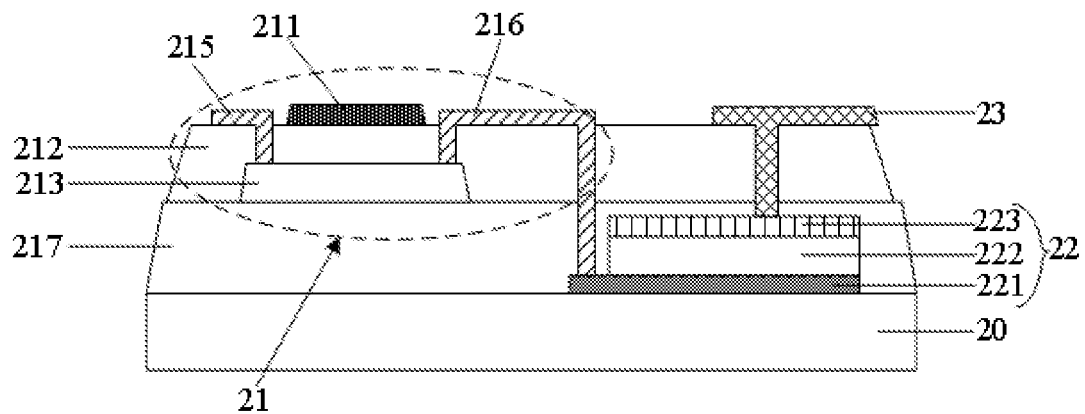
FIG. 2b is a schematic view showing a photosensitive assembly according to another embodiment of the present disclosure.

Embodiments of the present disclosure provide a photosensitive assembly. As shown in FIGS. 2a and 2b, the photosensitive assembly includes a substrate 20, a thin-film transistor 21 and a photosensitive unit 22 on a surface of the substrate 20, and an insulating layer between an active layer 213 and a photosensitive unit 22. The photosensitive unit 22 includes a first electrode 221, a photosensitive layer 222, and a second electrode 223 sequentially arranged on the substrate 20. The drain electrode 216 of the thin-film transistor 21 is electrically connected to the first electrode 221. The active layer 213 of the thin-film transistor 21 is located on a surface of the insulating layer (the gate insulating layer 212 in FIG. 2a, or the insulating layer 217 in FIG. 2b) away from the substrate 20, and the photosensitive unit 22 is located on a surface of the insulating layer proximate to the substrate 20.

Optionally, as shown in FIG. 2a and FIG. 2b, an orthogonal projection of at least one of the gate electrode 211 and the active layer 213 on the substrate 20 does not overlap an orthogonal projection of the photosensitive unit 22 on the substrate 20. Referring to FIGS. 2a and 2b, in addition to the portion (or the drain electrode 216) where the drain electrode 216 of the thin-film transistor 21 and the first electrode 221 of the photosensitive unit 22 are electrically connected, the orthogonal projection of the thin-film transistor 21 on the substrate 20 does not overlap the photosensitive unit 22 on the substrate 20.

In the present disclosure, the materials of the respective structures in the thin-film transistor 21 and the photosensitive unit 22 are not limited, as long as the respective structures in the thin-film transistor 21 and the photosensitive unit 22 can achieve their own functions.

For example, in the thin-film transistor 21, the gate electrode 211 may include a MoNb thin film, a Cu thin film, and a MoNb thin film sequentially arranged on the substrate 20; or a Mo thin film, an AlNd thin film and a Mo thin film sequentially arranged on the substrate 20. The gate insulating layer 212 includes at least one of $SiN_x$ and $SiO_x$. The active layer 213 may include amorphous silicon, polycrystalline silicon, metal oxide, organic, or the like. For example, the material of the active layer 213 may be indium gallium zinc oxide (IGZO). In the process of forming the active layer 213, the active layer 213 may also be annealed to reduce defects of the thin-film transistor 21. The source electrode 215 and the drain electrode 216 may be a MoNb thin film, a Cu thin film, and a MoNb thin film sequentially arranged on the substrate 20; or a Mo thin film, an AlNd thin film and a Mo thin film sequentially arranged on the substrate 20.

In the photosensitive unit 22, the first electrode 221 and/or the second electrode 223 are transparent conductive materials such as indium tin oxide (ITO), so that light is emitted from the first electrode 221 and/or the second electrode 223 to the photosensitive layer 222. The photosensitive layer 222 is a photosensitive material containing a-Si, and the photosensitive layer 222 may be annealed in the process of forming the photosensitive layer 222.

For example, if the light enters the photosensitive unit 22 from the side of the photosensitive unit 22 away from the substrate 20, at least the second electrode 223 is a transparent conductive material; and if the light enters the photosensitive unit 22 from the side of the photosensitive unit 22 proximate to the substrate 20, at least the first electrode 221 is a transparent conductive material.

Further, in the present disclosure, the structure of the thin-film transistor 21 is not limited, and it may be a bottom gate type thin-film transistor as shown in FIG. 2a or a top gate type thin-film transistor as shown in FIG. 2b.

As shown in FIG. 2a, the thin-film transistor 21 is of a bottom gate type, and the positional relationship of the thin-film transistor 21 and the photosensitive unit 22 may include the following several situations.

In the first situation, the photosensitive unit 22 including the first electrode 221, the photosensitive layer 222, and the second electrode 223 is arranged on the substrate 20, thereafter the thin-film transistor 21 is arranged on the substrate 20. Among them, the thin-film transistor 21 includes a gate electrode 211, a gate insulating layer 212, an active layer 213, a source electrode 215, and a drain electrode 216 sequentially arranged on the substrate 20. The gate insulating layer 212 is the insulating layer.

In the second situation, the first electrode 221 of the photosensitive unit 22 and the photosensitive layer 222 are arranged on the substrate 20, thereafter the gate electrode 211 of the thin-film transistor 21 and the second electrode 223 of the photosensitive unit 22 are arranged on the substrate 20 by a single patterning process, and finally the gate insulating layer 212, the active layer 213, and the source electrode 215 and drain electrode 216 of the thin-film transistor 21 are sequentially arranged on the surface of the gate electrode 211 away from the substrate 20. Among them, the gate insulating layer 212 is the insulating layer.

In this embodiment, since the gate electrode 211 of the thin-film transistor 21 and the second electrode 223 of the photosensitive unit 22 are formed by a single patterning process, the preparation process of the photosensitive assembly can be simplified.

In the third situation, the gate electrode 211 of the thin-film transistor 21 and the first electrode 221 of the photosensitive unit 22 are arranged on the substrate 20, thereafter the photosensitive layer 222 and the second electrode 223 of the photosensitive unit 22 are arranged on the surface of the first electrode 221 away from the substrate 20, and finally the gate insulating layer 212, the active layer 213, and the source electrode 215 and the drain electrode 216 of the thin-film transistor 21 are sequentially arranged on the surface of the gate electrode 211 away from the substrate 20. Among them, the gate insulating layer 212 is the insulating layer.

In this embodiment, since the gate electrode 211 of the thin-film transistor 21 and the first electrode 221 of the photosensitive unit 22 are formed by a single patterning process, the preparation process of the photosensitive assembly can be simplified.

Of course, when the thin-film transistor 21 is of a bottom gate type, the positional relationship between the thin-film transistor 21 and the photosensitive unit 22 may be other conditions, which is not limited herein, as long as the active layer 213 of the thin-film transistor 21 is located on a surface of the insulating layer away from the substrate 20, and the photosensitive unit 22 is located on a surface of the insulating layer proximate to the substrate 20.

As shown in FIG. 2b, the thin-film transistor 21 is of a top gate type, and the positional relationship of the thin-film transistor 21 and the photosensitive unit 22 may include the following situations.

In the first situation, the photosensitive unit 22 including the first electrode 221, the photosensitive layer 222, and the second electrode 223 is arranged on the substrate 20, thereafter the thin-film transistor 21 is arranged on the substrate 20. The thin-film transistor 21 includes a source electrode 215 and a drain electrode 216, an active layer 213, a gate insulating layer 212, and a gate electrode 211 sequentially arranged on the substrate 20.

In the second situation, the first electrode 221 and the photosensitive layer 222 of the photosensitive unit 22 are arranged on the substrate 20, thereafter the source electrode 215 and the drain electrode 216 of the thin-film transistor 21 and the second electrode 223 of the photosensitive unit 22 are arranged on the substrate 20, and finally the active layer 213, the gate insulating layer 212, and the gate electrode 211 of the thin-film transistor 21 are sequentially arranged on the surface of the source electrode 215 and the drain electrode 216 away from the substrate 20.

In this embodiment, since the source electrode 215 and the drain electrode 216 of the thin-film transistor 21, and the second electrode 223 of the photosensitive unit 22 are formed by a single patterning process, the preparation process of the photosensitive assembly can be simplified.

In the third situation, the source electrode 215 and the drain electrode 216 of the thin-film transistor 21 and the first electrode 221 of the photosensitive unit 22 are arranged on the substrate 20, thereafter the photosensitive layer 222 and the second electrode 223 of the photosensitive unit 22 are arranged on the surface of the first electrode 221 away from the substrate 20, and finally the active layer 213, the gate insulating layer 212, and the gate electrode 211 of the thin-film transistor 21 are sequentially arranged on the surface of the source electrode 215 and the drain electrode 216 away from the substrate 20.

In this embodiment, since the source electrode 215 and the drain electrode 216 of the thin-film transistor 21, and the first electrode 221 of the photosensitive unit 22 are formed by a single patterning process, the preparation process of the photosensitive assembly can be simplified.

Of course, when the thin-film transistor 21 is of a top gate type, the positional relationship between the thin-film transistor 21 and the photosensitive unit 22 may be other conditions, which is not limited herein, as long as the active layer 213 of the thin-film transistor 21 is located on the surface of the insulating layer away from the substrate 20, and the photosensitive unit 22 is located on the surface of the insulating layer proximate to the substrate 20.

In the photosensitive assembly of the present disclosure, the insulating layer functions to separate the active layer 213 of the thin-film transistor 21 and the photosensitive unit 22 along the thickness direction of the substrate 20, so that an active layer 213 of the thin-film transistor 21 is located on a surface of the insulating layer away from the substrate 20, and the photosensitive unit 22 is located on the surface of the insulating layer proximate to the substrate 20.

In the structure shown in FIG. 2a, a gate insulating layer 212 can be used as the insulating layer to separate the active layer 213 of the thin-film transistor 21 and the photosensitive unit 22. In the structure shown in FIG. 2b, the insulating layer 217 separates the active layer 213 of the thin-film transistor 21 and the photosensitive unit 22.

Embodiments of the present disclosure provide a photosensitive assembly, in which an active layer 213 of a thin-film transistor 21 is located on a surface of the insulating layer away from the substrate 20, and a photosensitive unit 22 is located on a surface of the insulating layer proximate to the substrate 20. In the preparation of the photosensitive assembly, the photosensitive unit 22 may be formed on the substrate 20, and then the active layer 213 of the thin-film transistor 21 is formed. As a result, even if the photosensitive layer 222 of the photosensitive unit 22 includes a material containing a large amount of hydrogen element such as a-Si, the hydrogen element does not enter into the active layer 213. Therefore, the hydrogen element does not enter into the channel region of the thin-film transistor 21 upon operating, thereby preventing the hydrogen element in the photosensitive layer 222 from adversely affecting the electrical performance of the thin-film transistor 21.

Optionally, as shown in FIG. 2a, the photosensitive assembly includes a first electrode layer and a second electrode layer. The first electrode layer includes a gate electrode 211 of the thin-film transistor 21, and an electrode 221 of the photosensitive unit 22, and the second electrode layer includes a source electrode 215 and a drain electrode 216 of the thin-film transistor 21, and a conductive lead 23. The conductive lead 23 is electrically connected to the second electrode 223. The insulating layer is the gate insulating layer 212 of the thin-film transistor 21.

That is, the gate electrode 211 of the thin-film transistor 21 and the first electrode 221 of the photosensitive unit 22 are formed by a single patterning process, and the source electrode 215 and the drain electrode 216 of the thin-film transistor 21 and the conductive lead 23 are formed by a single patterning process. The drain electrode 216 is electrically connected to the first electrode 221 through a via hole on the gate insulating layer 212, and the conductive lead 23 is electrically connected to the second electrode 223 through another via hole on the gate insulating layer 212.

Among them, after the photosensitive unit 22 is exposed to light, the optical signal is converted into an electrical signal, and the electrical signal is transmitted to the external circuit through the conductive lead 23 electrically connected to the second electrode 223.

In the embodiment shown in FIG. 2a of the present disclosure, the thin-film transistor 21 is a bottom gate type thin-film transistor. In the embodiment shown in FIG. 2b of the present disclosure, the thin-film transistor 21 is a top gate type thin-film transistor. For the embodiment shown in FIG. 2b, an insulating layer 217 is located between an active layer of the thin-film transistor and the photosensitive unit, such that the active layer 212 of the thin-film transistor 21 is located on a surface of the insulating layer 217 away from the substrate 20, and the photosensitive unit 22 is located on a surface of the insulating layer 217 proximate to the substrate 20.

In the embodiment of the present disclosure, the gate electrode 211 of the thin-film transistor 21 and the first electrode 221 of the photosensitive unit 22 are formed by a single patterning process, and the source electrode 215 and the drain electrode 216 of the thin-film transistor 21 and the conductive lead 23 are formed by a single patterning process. Thus, the preparation process of the photosensitive assembly can be simplified.

Further optionally, as shown in FIG. 2a, the thin-film transistor 21 further includes an etch stopping layer 214 covering the insulating layer (i.e., the gate insulating layer 212).

In this embodiment, the drain electrode 216 is electrically connected to the first electrode 221 through a via hole on the etch stopping layer 214 and the gate insulating layer 212, and the conductive lead 23 is electrically connected to the second electrode 223 through another via hole on the etch stopping layer 214 and the gate insulating layer 212.

In the embodiment of the present disclosure, after the etch stopping layer 214 is formed, a via hole for connecting the drain electrode 216 and the first electrode 221, a via hole for connecting the conductive lead 23 and the second electrode 223, and a via hole for connecting the source electrode 215 and the drain electrode 216 with the active layer 213 are formed by a single patterning process. In the related art (FIG. 1), a via hole for connecting the source electrode 215 and the drain electrode 216 with the active layer 213, and a via hole for connecting the conductive lead 23 and the second electrode 223 are respectively formed by a plurality of patterning processes. As compared with the related art, the embodiments of the present disclosure can simplify the preparation process of the photosensitive component.

Optionally, the pattern of the photosensitive layer 222 is the same as the pattern of the second electrode 223.

In the embodiment of the present disclosure, the photosensitive layer 222 and the second electrode 223 can be prepared by using a single mask, which is advantageous for cost saving.

Embodiments of the present disclosure provide an array substrate, including the photosensitive assembly of any of the foregoing embodiments.

Figure 3:
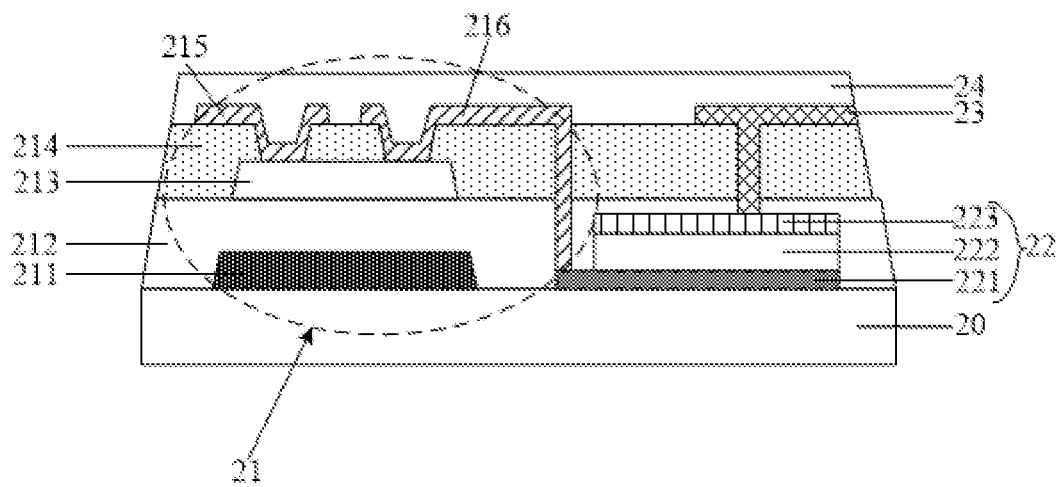
FIG. 3 is a schematic view showing an array substrate according to one embodiment of the present disclosure.

On this basis, as shown in FIG. 3, the array substrate may further include an overcoat 24 located on a surface of the source electrode 215 and the drain electrode 216 away from the substrate 20. In the embodiment of the present disclosure, it is not necessary to provide a via hole on the overcoat 24 to electrically connect the conductive lead 23 with the second electrode 223. The material of the passivation layer 24 may be, for example, $SiN_x$ or $SiO_x$. Since the hydrogen element is contained in the $SiN_x$, and the passivation layer 24 is formed after the formation of the active layer 213, the material of the passivation layer 24 of the embodiment of the present disclosure is optionally $SiO_x$.

In the embodiment, the array substrate may be an array substrate for forming an OLED display panel.

It should be noted that the array substrate includes a plurality of sub-pixel regions, each of the sub-pixel regions including a light emitting device (e.g., an OLED light emitting device), in which light emitted by the light emitting device may be irradiated onto the photosensitive unit 22 of the photosensitive assembly. The photosensitive unit 22 is arranged on the light exiting side of the light emitting device, and the material of the photosensitive unit 22 proximate to the electrode of the light emitting device is a transparent conductive material.

For example, since the light emitting device emits light toward the side proximate to the substrate 20, the photosensitive unit 22 is arranged on the surface of the light emitting device proximate the substrate 20, and the material of the second electrode 223 of the photosensitive unit 22 is a transparent conductive material.

In this embodiment, in order to prevent the photosensitive assembly from affecting the aperture ratio of the array substrate, for the thin-film transistor 21, the orthogonal projection of the thin-film transistor 21 on the substrate 20 may be located within the orthogonal projection of a region between adjacent sub-pixel regions on the substrate 20; and for the photosensitive unit 22, the position thereof may be the following situations.

In the first situation, the first electrode 221, the photosensitive sensing layer 222, and the second electrode 223 are all transparent materials, and the orthogonal projection of the photosensitive unit 22 on the substrate 20 completely overlaps or partially overlaps the orthogonal projection of the sub-pixel region on the substrate 20.

In the second situation, both the first electrode 221 or the second electrode 223 are made of a light-shielding material, and the orthogonal projection of the photosensitive unit 22 on the substrate 20 overlaps the orthogonal projection of the sub-pixel region on the substrate 20. When the array substrate is applied to the display device, in order not to affect the normal display of the display device, the photosensitive unit 22 should be as small as possible under normal operation.

Embodiments of the present disclosure provide an array substrate including the photosensitive assembly, in which an active layer 213 of a thin-film transistor 21 is located on a surface of the insulating layer away from the substrate 20, and a photosensitive unit 22 is located on a surface of the insulating layer proximate to the substrate 20. In the preparation of the photosensitive assembly, the photosensitive unit 22 may be formed on the substrate 20, and then the active layer 213 of the thin-film transistor 21 is formed. As a result, even if the photosensitive layer 222 of the photosensitive unit 22 includes a material containing a large amount of hydrogen element such as a-Si, the hydrogen element does not enter into the active layer 213. Therefore, the hydrogen element does not enter into the channel region of the thin-film transistor 21 upon operating, thereby preventing the hydrogen element in the photosensitive layer 222 from adversely affecting the electrical performance of the thin-film transistor 21.

Embodiments of the present disclosure provide a display device, including the array substrate described in the above embodiments.

The display device may be a display panel or a display including a display panel. For example, the display device may be an OLED display panel.

The embodiment of the present disclosure provides a display device having the same technical effects as the above array substrate, which will not be described herein again.

Embodiment of the present disclosure provide a method for preparing a photosensitive assembly, as shown in FIG. 2a and FIG. 2b, including: forming a thin-film transistor, a photosensitive unit, and an insulating layer between an active layer of the thin-film transistor and the photosensitive unit on a surface of a substrate; in which the photosensitive unit includes a first electrode, a photosensitive layer, and a second electrode sequentially arranged on the substrate; a drain electrode of the thin-film transistor is electrically connected to the first electrode; an active layer of the thin-film transistor is located on a surface of the insulating layer away from the substrate, and the photosensitive unit is located on a surface of the insulating layer proximate to the substrate.

Figure 4:
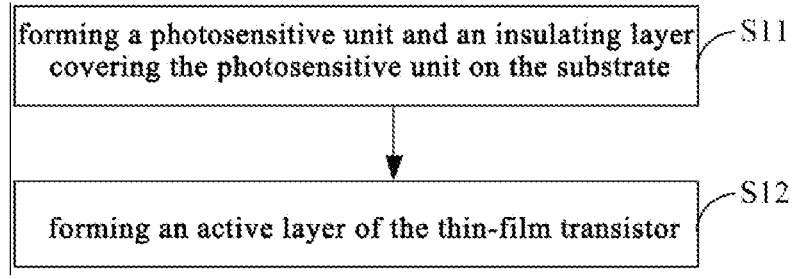
FIG. 4 is a schematic flow chart I for preparing a photosensitive assembly according to an embodiment of the present disclosure.
Figure 5:
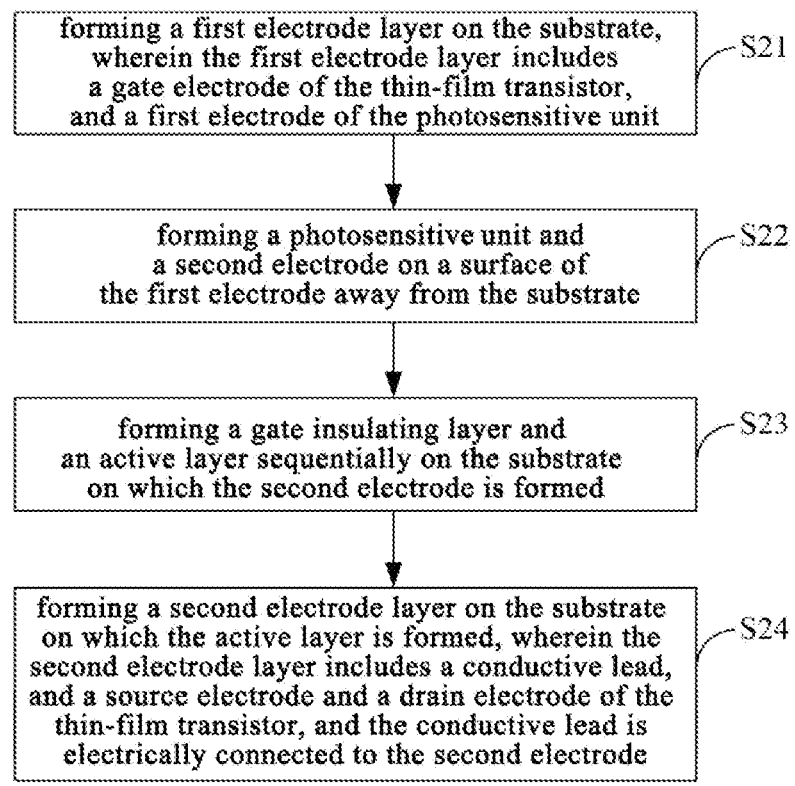
FIG. 5 is a schematic flow chart II for preparing a photosensitive assembly according to an embodiment of the present disclosure.

As shown in FIG. 4, the step of forming the thin-film transistor, the photosensitive unit, and the insulating layer between the active layer of the thin-film transistor and the photosensitive unit on the surface of the substrate may include the following sub-steps.

S11, a photosensitive unit 22 and an insulating layer covering the photosensitive unit 22 (the gate insulating layer 212 in FIG. 2a, or the insulating layer 217 in FIG. 2b) are formed on the substrate 20.

S12, an active layer 213 of the thin-film transistor 21 is formed.

Of course, in addition to step S11 and step S12, other sub-steps may be included. Specifically, when the structures of the thin-film transistors 21 are different, for example, the thin-film transistors 21 may be of a bottom gate type or a top gate type, the preparation sequence for the respective structures in the thin-film transistors 21 and the respective structures in the photosensitive units 22 are also different.

As shown in FIG. 2a, the thin-film transistor 21 is of a bottom gate type, and the preparation sequence of the thin-film transistor 21 and the photosensitive unit 22 may include the following situations.

In the first situation, the first electrode 221, the photosensitive layer 222, and the second electrode 223 are sequentially formed on the substrate 20, thereafter the thin-film transistor 21 is formed on the substrate 20. The forming the thin-film transistor 21 includes sequentially forming a gate electrode 211, a gate insulating layer 212, an active layer 213, a source electrode 215 and a drain electrode 216 on the substrate 20.

In the second situation, the first electrode 221 of the photosensitive unit 22 and the photosensitive layer 222 are formed on the substrate 20, thereafter the gate electrode 211 of the thin-film transistor 21 and the second electrode 223 of the photosensitive unit 22 are formed on the substrate 20 by a single patterning process, and finally the gate insulating layer 212, the active layer 213, and the source electrode 215 and drain electrode 216 of the thin-film transistor 21 are sequentially formed on the surface of the gate electrode 211 away from the substrate 20.

In this embodiment, since the gate electrode 211 of the thin-film transistor 21 and the second electrode 223 of the photosensitive unit 22 are formed by a single patterning process, the preparation process of the photosensitive assembly can be simplified.

In the third situation, the gate electrode 211 of the thin-film transistor 21 and the first electrode 221 of the photosensitive cell 22 are formed on the substrate 20 by a single patterning process, thereafter the photosensitive layer 222 and the second electrode 223 of the photosensitive cell 22 are formed on the surface of the first electrode 221 away from the substrate 20, and finally the gate insulating layer 212, the active layer 213, and the source electrode 215 and the drain electrode 216 of the thin-film transistor 21 are sequentially formed on the surface of the gate electrode 211 away from the substrate 20.

In this embodiment, since the gate electrode 211 of the thin-film transistor 21 and the first electrode 221 of the photosensitive unit 22 are formed by a single patterning process, the preparation process of the photosensitive assembly can be simplified.

Of course, when the thin-film transistor 21 is of a bottom gate type, the preparation sequence of the thin-film transistor 21 and the photosensitive unit 22 may be other situations, which is not limited herein, as long as the active layer 213 of the thin-film transistor 21 is formed before the formation of the photosensitive unit 22.

As shown in FIG. 2b, the thin-film transistor 21 is of a top gate type, and the preparation sequence of the thin-film transistor 21 and the photosensitive unit 22 may include the following situations.

In the first situation, the first electrode 221, the photosensitive layer 222, and the second electrode 223 are sequentially formed on the substrate 20, thereafter the thin-film transistor 21 is formed on the substrate 20. The step of forming the thin-film transistor 21 includes sequentially forming a source electrode 215 and a drain electrode 216, an active layer 213, a gate insulating layer 212, and a gate electrode 211 on the substrate 20.

In the second situation, the first electrode 221 and the photosensitive layer 222 of the photosensitive unit 22 are formed on the substrate 20 by a single patterning process, thereafter the source electrode 215 and the drain electrode 216 of the thin-film transistor 21 and the second electrode 223 of the photosensitive unit 22 are formed on the substrate 20, and finally the active layer 213, the gate insulating layer 212, and the gate electrode 211 of the thin-film transistor 21 are sequentially formed on the surface of the source electrode 215 and the drain electrode 216 away from the substrate 20.

In this embodiment, since the source electrode 215 and the drain electrode 216 of the thin-film transistor 21, and the second electrode 223 of the photosensitive unit 22 are formed by a single patterning process, the preparation process of the photosensitive assembly can be simplified.

In the third situation, the source electrode 215 and the drain electrode 216 of the thin-film transistor 21 and the first electrode 221 of the photosensitive unit 22 are arranged on the substrate 20 by a single patterning process, thereafter the photosensitive layer 222 and the second electrode 223 of the photosensitive unit 22 are formed on the surface of the first electrode 221 away from the substrate 20, and finally the active layer 213, the gate insulating layer 212, and the gate electrode 211 of the thin-film transistor 21 are sequentially formed on the surface of the source electrode 215 and the drain electrode 216 away from the substrate 20.

In this embodiment, since the source electrode 215 and the drain electrode 216 of the thin-film transistor 21, and the first electrode 221 of the photosensitive unit 22 are formed by a single patterning process, the preparation process of the photosensitive assembly can be simplified.

Of course, when the thin-film transistor 21 is of a top gate type, the preparation sequence of the thin-film transistor 21 and the photosensitive unit 22 may be other situations, which is not limited herein, as long as the active layer 213 of the thin-film transistor 21 is formed before the formation of the photosensitive unit 22.

Optionally, as shown in FIG. 2a and FIG. 2b, an orthogonal projection of at least one of the gate electrode 211 and the active layer 213 on the substrate 20 does not overlap an orthogonal projection of the photosensitive unit 22 on the substrate 20. Referring to FIGS. 2a and 2b, in addition to the portion (or the drain electrode 216) where the drain electrode 216 of the thin-film transistor 21 and the first electrode 221 of the photosensitive unit 22 are electrically connected, the orthogonal projection of the thin-film transistor 21 on the substrate 20 does not overlap the orthogonal projection of the photosensitive unit 22 on the substrate 20.

In the present disclosure, the materials of the respective structures in the thin-film transistor 21 and the photosensitive unit 22 are not limited, as long as the respective structures in the thin-film transistor 21 and the photosensitive unit 22 can achieve their own functions.

For example, in the thin-film transistor 21, the gate electrode 211 may include a MoNb thin film, a Cu thin film, and a MoNb thin film sequentially formed on the substrate 20; or a Mo thin film, an AlNd thin film and a Mo thin film sequentially formed on the substrate 20. The gate insulating layer 212 includes at least one of $SiN_x$ and $SiO_x$. The active layer 213 may include amorphous silicon, polycrystalline silicon, metal oxide, organic, or the like. For example, the active layer 213 may be made of IGZO. In the process of forming the active layer 213, the active layer 213 may also be annealed to reduce defects of the thin-film transistor 21. The source electrode 215 and the drain electrode 216 may include a MoNb thin film, a Cu thin film, and a MoNb thin film sequentially formed on the substrate 20; or a Mo thin film, an AlNd thin film and a Mo thin film sequentially formed on the substrate 20.

In the photosensitive unit 22, the first electrode 221 and/or the second electrode 223 are made of transparent conductive materials such as ITO, so that light is emitted from the first electrode 221 and/or the second electrode 223 to the photosensitive layer 222. The photosensitive layer 222 is made of a photosensitive material containing a-Si, and the photosensitive layer 222 may be annealed in the process of forming the photosensitive layer 222.

For example, if the light enters into the photosensitive unit 22 from the side of the photosensitive unit 22 away from the substrate 20, at least the second electrode 223 is made of a transparent conductive material; and if the light enters into the photosensitive unit 22 from the side of the photosensitive unit 22 proximate to the substrate 20, at least the first electrode 221 is a transparent conductive material.

The embodiment of the present disclosure provides a method for preparing a photosensitive assembly, which has the same technical effects as the above photosensitive assembly. Such technical effects will not be described herein again.

Specifically, taking the bottom gate type thin-film transistor shown in FIG. 2a as an example. As shown in FIGS. 5 to 8, the step of forming the thin-film transistor, the photosensitive unit, and the insulating layer between the active layer of the thin-film transistor and the photosensitive unit on the surface of the substrate may include the following sub-steps.

Figure 6:
FIG. 6 is a process diagram I for preparing a photosensitive assembly according to an embodiment of the present disclosure.

S21, as shown in FIG. 6, a first electrode layer is formed on the substrate 20, the first electrode layer including a gate electrode 211 of the thin-film transistor 21 and a first electrode 221 of the photosensitive unit 22.

That is, the gate electrode 211 of the thin-film transistor 21 and the first electrode 221 of the photosensitive unit 22 are formed by a single patterning process.

Figure 7:
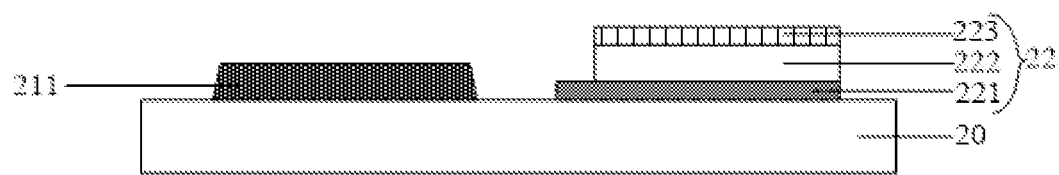
FIG. 7 is a process diagram II for preparing a photosensitive assembly according to an embodiment of the present disclosure.

S22, as shown in FIG. 7, a photosensitive layer 222 and a second electrode 223 are formed on a surface of the first electrode 221 away from the substrate 20.

It should be noted that the orthogonal projection of the photosensitive layer 222 and the second electrode 223 on the substrate 20 has an overlapping area with the orthogonal projection of the first electrode 221 on the substrate 20, and the orthogonal projection of the photosensitive layer 222 and the second electrode 223 on the substrate 20 does not overlap the orthogonal projection of the thin-film transistor 21 on the substrate 20.

Figure 8:
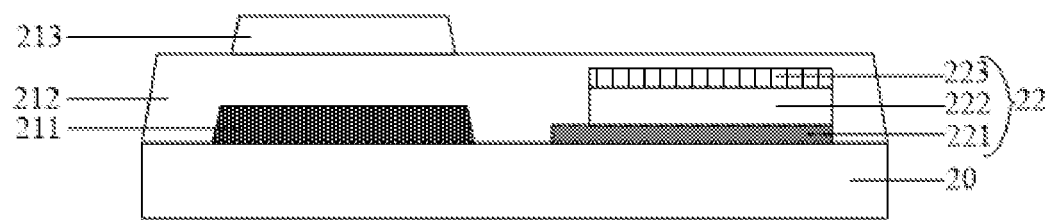
FIG. 8 is a process diagram III for preparing a photosensitive assembly according to an embodiment of the present disclosure.

S23, as shown in FIG. 8, a gate insulating layer 212 and an active layer 213 are sequentially formed on the substrate 20 on which the second electrode 223 is formed.

The gate insulating layer 212 is a continuous layer and completely covers the gate electrode 211 and the photosensitive unit 22.

S24, as shown in FIG. 2a, a second electrode layer is formed on the substrate 20 on which the active layer 213 is formed, the second electrode layer includes a conductive lead 23, and a source electrode 215 and a drain electrode 216 of the thin-film transistor 21, and the conductive lead 23 is electrically connected to the second electrode 223.

That is, the source electrode 215 and the drain electrode 216 of the thin-film transistor 21 as well as the conductive leads 23 are formed by a single patterning process.

After the gate insulating layer 212 is formed, a via hole for connecting the drain electrode 216 with the first electrode 221 and a via hole for connecting the conductive lead 23 with the second electrode 223 are formed on the gate insulating layer 212 by a single patterning process.

In this embodiment, after the photosensitive unit 22 is exposed to light, the optical signal is converted into an electrical signal, and the electrical signal is transmitted to the external circuit through the conductive lead 23 electrically connected to the second electrode 223.

In the embodiment of the present disclosure, the gate electrode 211 of the thin-film transistor 21 and the first electrode 221 of the photosensitive unit 22 are formed by a single patterning process, and the source electrode 215 and the drain electrode 216 of the thin-film transistor 21 and the conductive lead 23 are formed by a single patterning process, and thus the preparation process of the photosensitive assembly can be simplified.

Further optionally, after the forming the active layer 213 and before the forming the second electrode layer, the method further includes: forming an etch stopping layer 214 between the active layer 213 and the second electrode layer.

In this embodiment, after the etch stopping layer 214 is formed, the via hole for connecting the source electrode 215 and the drain electrode 216 with the active layer 213, the via hole for connecting the drain electrode 216 with the first electrode 221, and the via hole for connecting the conductive lead 23 with the second electrode 223 are formed on the gate insulating layer 212 and the etch stopping layer 214 by a single patterning process.

In the embodiment of the present disclosure, after the etch stopping layer 214 is formed, a via hole for connecting the drain electrode 216 with the first electrode 221, a via hole for connecting the conductive lead 23 with the second electrode 223, and a via hole for connecting the source electrode 215 with the drain electrode 216 with the active layer 213 are formed by a single patterning process. While in the related art (as shown in FIG. 1), a via hole for connecting the source electrode 215 and the drain electrode 216 with the active layer 213 and the via hole for connecting the conductive lead 23 with the second electrode 223 are formed respectively by different patterning processes. Thus, embodiments of the present disclosure can simplify the preparation process of the photosensitive assembly.

Optionally, the photosensitive layer 222 and the second electrode 223 are formed by a single patterning process.

In the embodiment of the present disclosure, since the patterns of the photosensitive layer 222 and the second electrode 223 may be the same, the photosensitive layer 222 and the second electrode 223 are formed by a single patterning process, and thus the preparation process of the photosensitive assembly is simplified.

Embodiments of the present disclosure provides a photosensitive assembly, a method for preparing the same, an array substrate, and a display device, in which an active layer of a thin-film transistor is located on a surface of the insulating layer away from the substrate, and a photosensitive unit is located on a surface of the insulating layer proximate to the substrate. In the preparation of the photosensitive assembly, the photosensitive unit may be formed on the substrate, and then the active layer of the thin-film transistor is formed. As a result, even if the photosensitive layer of the photosensitive unit includes a material containing a large amount of hydrogen element such as a-Si, the hydrogen element does not enter into the active layer. Therefore, the hydrogen element does not enter into the channel region of the thin-film transistor upon operating, thereby preventing the hydrogen element in the photosensitive layer from adversely affecting the electrical performance of the thin-film transistor.

The above description is merely the specific embodiment of the present disclosure, but the scope of the present disclosure is not limited thereto. Moreover, any person skilled in the art would readily conceive of modifications or substitutions within the technical scope of the present disclosure, and these modifications or substitutions shall also fall within the protection scope of the present disclosure. Therefore, the protection scope of the present disclosure should be determined by the scope of the claims.

What is claimed is:

1. A photosensitive assembly, comprising: a substrate, a thin-film transistor and a photosensitive unit on a surface of the substrate, an insulating layer between an active layer of the thin-film transistor and the photosensitive unit, and an etch stopping layer covering the insulating layer, and both the etch stopping layer and the active layer of the thin-film transistor covering a whole surface of the insulating layer away from the substrate;
wherein the photosensitive unit comprises a first electrode, a photosensitive layer, and a second electrode sequentially arranged on the substrate, a drain electrode of the thin-film transistor is electrically connected to the first electrode;
the active layer of the thin-film transistor is located on a surface of the insulating layer away from the substrate, and the photosensitive unit is located on a surface of the insulating layer proximate to the substrate; and
the etch stopping layer is separated from the photosensitive unit by the insulating layer and the etch stopping layer is not in physical contact with the photosensitive unit.

2. The photosensitive assembly of claim 1, further comprising: a first electrode layer and a second electrode layer;
wherein the first electrode layer comprises a gate electrode of the thin-film transistor, and the first electrode of the photosensitive unit;
the second electrode layer comprises a conductive lead, and a source electrode and a drain electrode of the thin-film transistor, in which the conductive lead is electrically connected to the second electrode;
the insulating layer is a gate insulating layer of the thin-film transistor.

3. The photosensitive assembly of claim 1, wherein a pattern of the photosensitive layer is the same as that of the second electrode.

4. The photosensitive assembly of claim 1, wherein an orthogonal projection of at least one of the gate electrode and the active layer on the substrate does not overlap an orthogonal projection of the photosensitive unit on the substrate.

5. An array substrate, comprising the photosensitive assembly of claim 1.

6. The array substrate of claim 5, further comprising: a first electrode layer and a second electrode layer;
wherein the first electrode layer comprises a gate electrode of the thin-film transistor, and a first electrode of the photosensitive unit;
the second electrode layer comprises a conductive lead, and a source electrode and a drain electrode of the thin-film transistor, in which the conductive lead is electrically connected to the second electrode;
the insulating layer is a gate insulating layer of the thin-film transistor.

7. The array substrate of claim 5, wherein a pattern of the photosensitive layer is the same as that of the second electrode.

8. The array substrate of claim 5, wherein an orthogonal projection of at least one of the gate electrode and the active layer on the substrate does not overlap an orthogonal projection of the photosensitive unit on the substrate.

9. A display device, comprising the array substrate of claim 5.

10. The display device of claim 9, further comprising: a first electrode layer and a second electrode layer;
wherein the first electrode layer comprises a gate electrode of the thin-film transistor, and a first electrode of the photosensitive unit;
the second electrode layer comprises a conductive lead, and a source electrode and a drain electrode of the thin-film transistor, in which the conductive lead is electrically connected to the second electrode;
the insulating layer is a gate insulating layer of the thin-film transistor.

11. The display device of claim 9, wherein a pattern of the photosensitive layer is the same as that of the second electrode.

12. The display device of claim 9, wherein an orthogonal projection of at least one of the gate electrode and the active layer on the substrate does not overlap an orthogonal projection of the photosensitive unit on the substrate.

13. A method for preparing a photosensitive assembly, comprising forming a thin-film transistor, a photosensitive unit, an insulating layer between an active layer of the thin-film transistor and the photosensitive unit, and an etch stopping layer covering the insulating layer on a surface of a substrate, and both the etch stopping layer and the active layer of the thin-film transistor covering a whole surface of the insulating layer away from the substrate;
- wherein the photosensitive unit comprises a first electrode, a photosensitive layer, and a second electrode sequentially arranged on the substrate, a drain electrode of the thin-film transistor is electrically connected to the first electrode;
- an active layer of the thin-film transistor is located on a surface of the insulating layer away from the substrate, and the photosensitive unit is located on a surface of the insulating layer proximate to the substrate; and
- the etch stopping layer is separated from the photosensitive unit by the insulating layer and the etch stopping layer is not in physical contact with the photosensitive unit.

14. The method of claim 13, wherein the step of forming the thin-film transistor, the photosensitive unit, and the insulating layer between the active layer of the thin-film transistor and the photosensitive unit on the surface of the substrate comprises:

- forming a first electrode layer on the substrate, wherein the first electrode layer comprises a gate electrode of the thin-film transistor and the first electrode of the photosensitive unit;
- forming a photosensitive layer and a second electrode on a surface of the first electrode away from the substrate;
- forming a gate insulating layer and the active layer sequentially on the substrate on which the second electrode is formed; and
- forming a second electrode layer on the substrate on which the active layer is formed, wherein the second electrode layer comprises a conductive lead, and a source electrode and a drain electrode of the thin-film transistor, and the conductive lead is electrically connected to the second electrode.

15. The method of claim 13, wherein the photosensitive layer and the second electrode are formed by a single patterning process.

16. The method of claim 13, wherein an orthogonal projection of at least one of the gate electrode and the active layer on the substrate does not overlap an orthogonal projection of the photosensitive unit on the substrate.

* * * * *